(12) United States Patent
Hirano et al.

(10) Patent No.: US 12,432,915 B2
(45) Date of Patent: Sep. 30, 2025

(54) SEMICONDUCTOR DEVICE HAVING A MEMORY ELEMENT WITH A SOURCE REGION AND DRAIN REGION AND HAVING MULTIPLE ASSISTANCE ELEMENTS

(71) Applicants: TOWER PARTNERS SEMICONDUCTOR CO., LTD., Uozu (JP); TOWER SEMICONDUCTOR LTD., Migdal Haemek (IL)

(72) Inventors: Hiroshige Hirano, Nara (JP); Hiroaki Kuriyama, Toyama (JP); Atsushi Noma, Toyama (JP)

(73) Assignees: TOWER PARTNERS SEMICONDUCTOR CO., LTD., Uozu (JP); TOWER SEMICONDUCTOR LTD., Migdal Haemek (IL)

( * ) Notice: Subject to any disclaimer, the term of this patent is extended or adjusted under 35 U.S.C. 154(b) by 797 days.

(21) Appl. No.: 17/827,589

(22) Filed: May 27, 2022

(65) Prior Publication Data

US 2023/0200062 A1 Jun. 22, 2023

(30) Foreign Application Priority Data

Dec. 16, 2021 (JP) ................. 2021-203984

(51) Int. Cl.
| | |
|---|---|
| H10B 41/41 | (2023.01) |
| G11C 16/14 | (2006.01) |
| H10B 41/10 | (2023.01) |
| H10B 41/35 | (2023.01) |
| H10D 30/68 | (2025.01) |

(52) U.S. Cl.
CPC ............. *H10B 41/41* (2023.02); *H10B 41/10* (2023.02); *H10B 41/35* (2023.02); *H10D 30/684* (2025.01); *H10D 30/6892* (2025.01); *G11C 16/14* (2013.01)

(58) Field of Classification Search
CPC . H10B 41/41; H10D 30/6892; G11C 16/0408
See application file for complete search history.

(56) References Cited

U.S. PATENT DOCUMENTS 7,839,683 B2 * 11/2010 Oka ........................ G11C 5/025
257/532
2020/0321057 A1 10/2020 Hirano et al.

FOREIGN PATENT DOCUMENTS

WO 2019/124356 A1 6/2019

* cited by examiner

*Primary Examiner* — William B Partridge
*Assistant Examiner* — Mehek Ahmed
(74) *Attorney, Agent, or Firm* — Maschoff Brennan

(57) ABSTRACT

A semiconductor device includes a memory cell on a semiconductor substrate. The memory cell includes a memory element, a first assistance element, and a second assistance element. The memory element includes a source region and a drain region, and a selection gate and a floating gate in series therebetween. The first assistance element includes a first impurity region and a first gate. The second assistance element includes a second impurity region and a second gate. The first and second gates are electrically connected to the floating gate. The second impurity region is connected to a signal line that is connected to the drain region or a signal line that is connected to the selection gate.

13 Claims, 12 Drawing Sheets

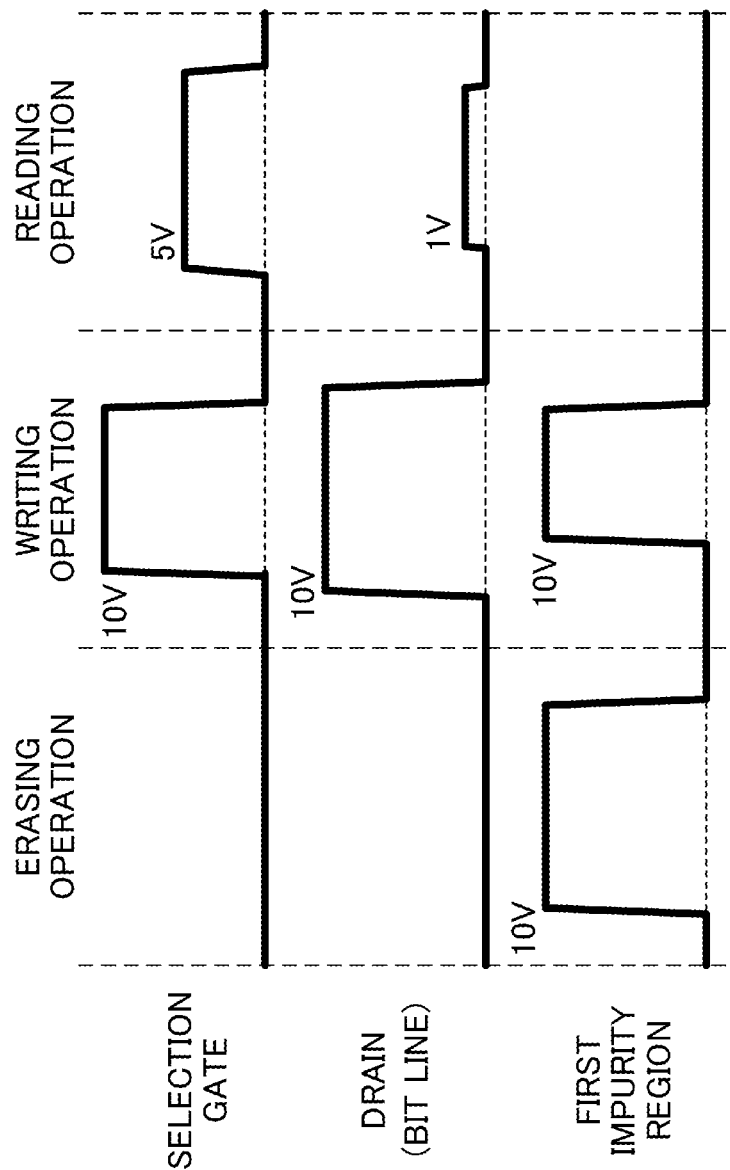

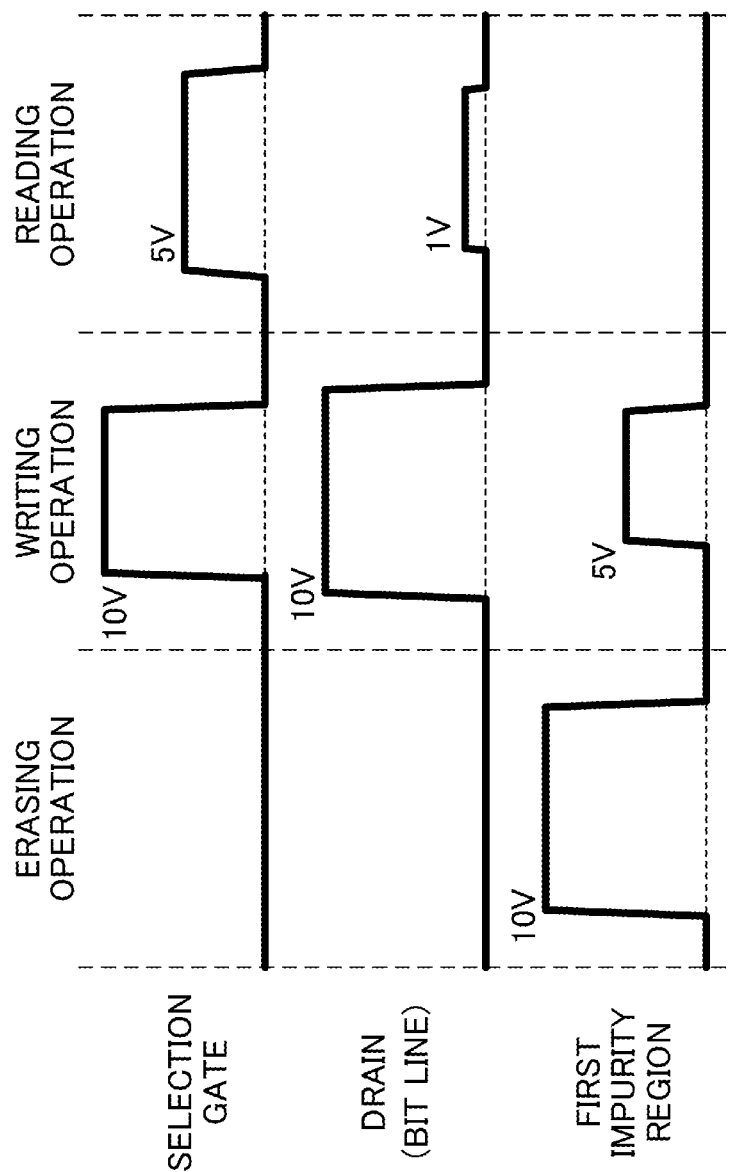

SEMICONDUCTOR DEVICE HAVING A MEMORY ELEMENT WITH A SOURCE REGION AND DRAIN REGION AND HAVING MULTIPLE ASSISTANCE ELEMENTS

CROSS-REFERENCE TO RELATED APPLICATION

This application claims priority to Japanese Patent Application No. 2021-203984 filed on Dec. 16, 2021, the entire disclosure of which is incorporated by reference herein.

BACKGROUND

Semiconductor memory devices are used in various electronic devices. For example, non-volatile memories (NVMs) are widely used in portable devices, for example.

In general, the NVMs are classified into multi-time programmable (MTP) memories and one-time programmable (OTP) memories. The MTP memories allow a plurality of times of writing as well as a plurality of times of reading. The OTP memories require no erasing operation, whereas the MTP memories require erasing operations.

As one type of the NVMs, single-poly NVMs requiring less additional manufacturing steps have been suggested. Each single-poly NVM includes a charge storage floating gate with a single layer of polysilicon. The single-poly NVM is compatible with a general complementary metal oxide semiconductor (CMOS) process, and therefore, is applied as a memory (embedded memory) embedded in a microcontroller, for example.

For example, International Patent Publication No. 2019/124356 is known as a technique in this field.

SUMMARY

In each MVM, there is a demand for efficient rewriting including an erasing operation. For example, erasing and writing operations need to be performed at lower voltages in shorter times. There is also a demand for reducing the areas of memory cells.

An achievement of at least one of the improvement in operation efficiency or the reduction in the areas of memory cells in a semiconductor device will be described below.

A semiconductor device according to the present disclosure includes a memory cell on a semiconductor substrate. The memory cell includes a memory element, a first assistance element, and a second assistance element. The memory element includes a source region, a drain region, and a selection gate and a floating gate in series between the source region and the drain region. The first assistance element includes a first impurity region and a first gate on the semiconductor substrate. The first gate is electrically connected to the floating gate. The second assistance element includes a second impurity region and a second gate on the semiconductor substrate. The second gate is electrically connected to the floating gate. The second impurity region is connected to a signal line that is connected to the drain region or a signal line that is connected to the selection gate.

Such a semiconductor device can increase the potential of the floating gate in the writing operation using the second assistance element, which allows efficient erasing and writing operations.

BRIEF DESCRIPTION OF THE DRAWINGS

FIG. 4 shows a timing chart of an operation signal of the semiconductor device according to the first embodiment.

FIG. 5 shows a timing chart of an operation signal of a semiconductor device according to Variation 1 of the first embodiment.

DETAILED DESCRIPTION

Embodiments of the present disclosure will be described below with reference to the drawings. The technical matters of the present disclosure are not limited to these embodiments. Changes and modifications can be made as appropriate as long as the advantages of the present disclosure are available.

First Embodiment

Figure 1:
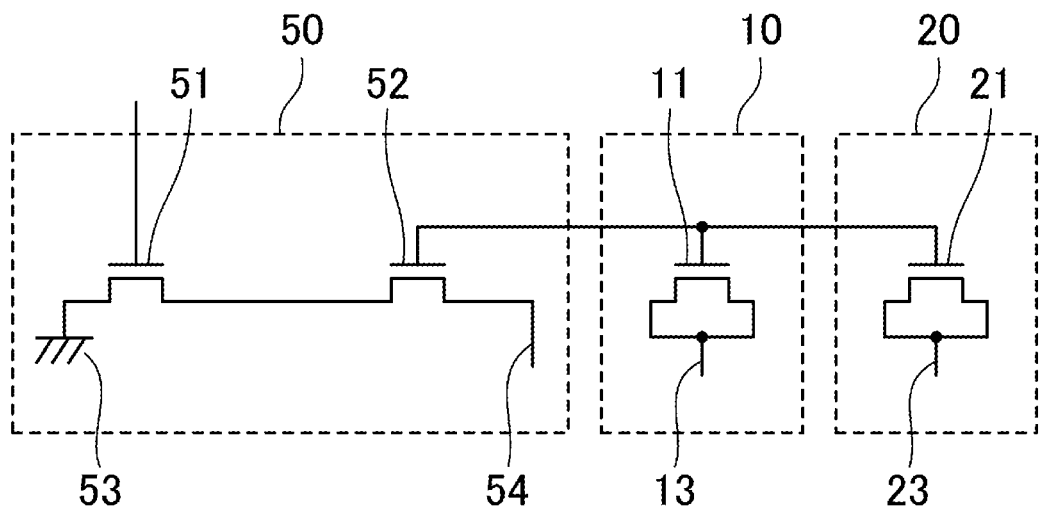
FIG. 1 shows a basic circuit configuration of a semiconductor device according to the present disclosure.
Figure 2:
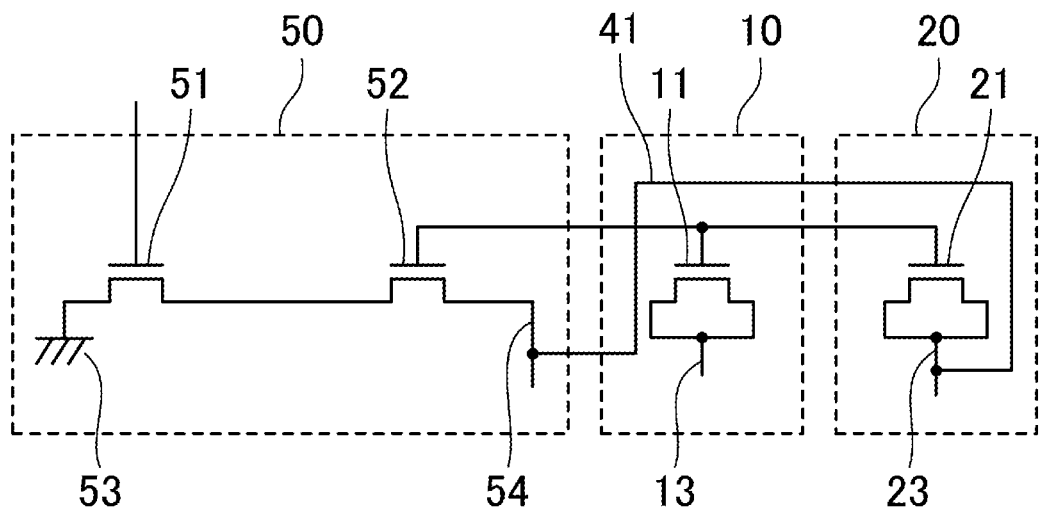
FIG. 2 shows a circuit configuration of a semiconductor device according to a first embodiment.
Figure 3A:
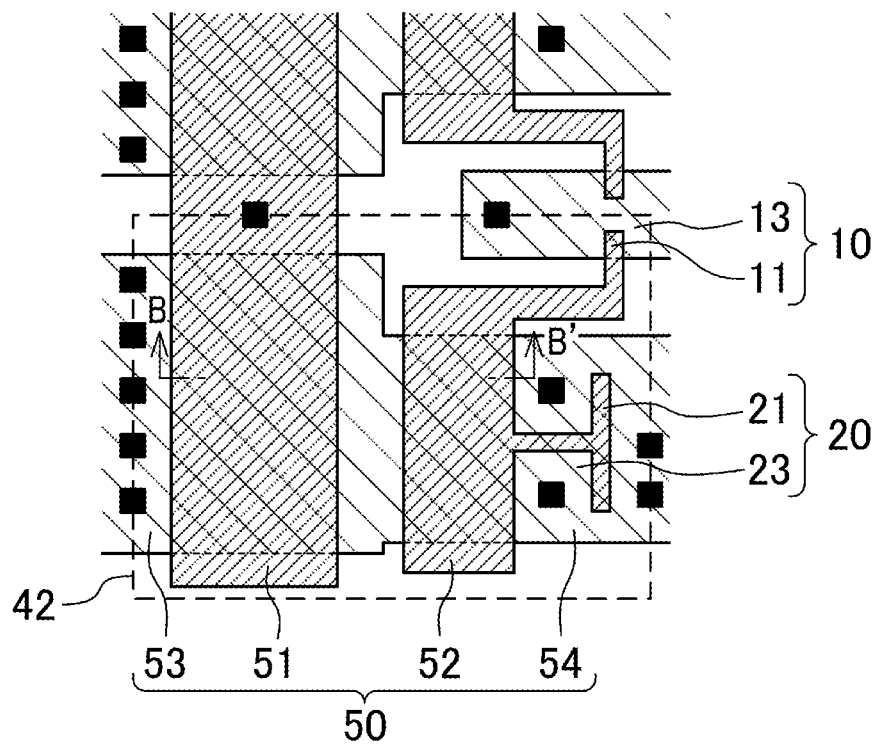
FIG. 3A shows a layout of the semiconductor device shown in FIG. 2.

FIG. 1 shows a basic circuit configuration of a semiconductor device according to the present disclosure. FIG. 2 specifically shows a circuit configuration of a semiconductor device according to a first embodiment with respect to the circuit configuration shown in FIG. 1. FIG. 3A shows, as an example, a plan view illustrating a layout of the semiconductor device according to the present disclosure.

First, the basic circuit configuration will be described. FIG. 1 shows a memory cell circuit including a memory element 50, a first assistance element 10, and a second assistance element 20.

The memory element 50 includes a source region 53 and a drain region 54, each formed as an impurity region on a semiconductor substrate, and a selection gate 51 and a floating gate 52 in series between the source and drain regions 53 and 54. The first assistance element 10 includes a first impurity region 13 and a first gate 11 on the semiconductor substrate. The first gate 11 is electrically connected to the floating gate 52. The second assistance element 20 includes a second impurity region 23 and a second gate 21 on the semiconductor substrate. The second gate 21 is electrically connected to the floating gate 52.

In this embodiment, the transistors including the gates are n-channel transistors. In this case, the source region 53 is connected to a power supply line Vss. The drain region 54 is connected to a bit line, and the selection gate 51 is connected to a word line.

Next, FIG. 2 shows that the second impurity region 23 of the second assistance element 20 is electrically connected to the drain region 54 of the memory element 50. FIG. 2 shows such an electrical connection 41 in addition to the circuit configuration shown in FIG. 1. Since the drain region 54 is connected to the bit line, the second impurity region 23 is also connected to the bit line.

With this configuration, in the semiconductor device according to this embodiment, the second impurity region 23 is controlled by a signal for controlling the drain region 54.

FIG. 3A shows a specific example layout of a semiconductor device corresponding to the circuit configuration shown in FIG. 2. As described above, the selection and floating gates 51 and 52 are arranged in series between the source and drain regions 53 and 54. The first assistance element 10 is formed including the first gate 11 and the first impurity region 13, whereas the second assistance element 20 is formed including the second gate 21 and the second impurity region 23.

In FIG. 3A, the area indicated by the narrower diagonal lines includes various gates (including the selection gate 51, the floating gate 52, the first gate 11, and the second gate 21), each formed above the semiconductor substrate with a gate insulating film (not shown) interposed between.

The area indicated by the wider diagonal lines is an active layer of the semiconductor substrate which are doped with impurities to obtain the source region 53, the drain region 54, the first impurity region 13, and the second impurity region 23. The active layer is defined by an isolation region obtained by embedding an insulating film in a semiconductor substrate.

Figure 3B:
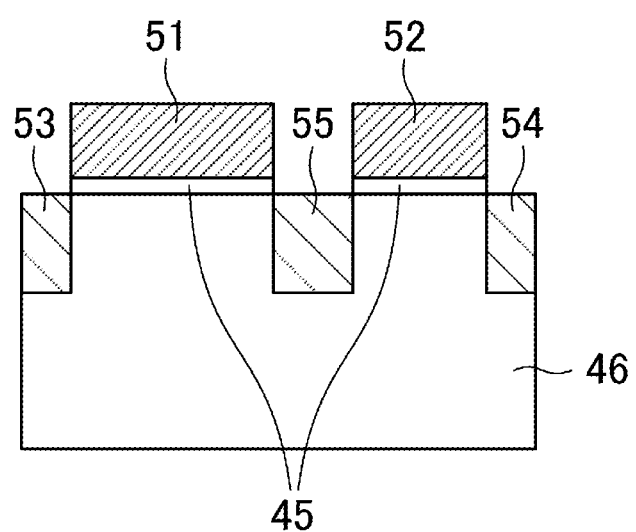
FIG. 3B schematically shows a cross section taken along line B-B' in FIG. 3A.

FIG. 3B schematically shows a cross section taken along line B-B' in FIG. 3A. This is a part corresponding to the memory element 50. The selection and floating gates 51 and 52 are formed above an active layer 46 of the semiconductor substrate with a gate insulating film 45 interposed therebetween. The source region 53 doped with the impurities is formed on a side of the selection gate 51 in the active layer 46, opposite to the floating gate 52. The drain region 54 doped with the impurities is formed on a side of the floating gate 52 in the active layer 46, opposite to the selection gate 51. Interposed between the selection and floating gates 51 and 52 in the active layer 46 is a connection region doped with impurities.

Although not shown, the cross section around each of the first and second gates 11 and 21 also includes a gate above the active layer with a gate insulating film interposed therebetween, and an impurity region on a side of the gate in the active layer.

The first assistance element 10 is formed using the first impurity region 13 independent from the drain region 54.

The second assistance element 20 is formed in the drain region 54. That is, the drain region 54 and the second impurity region 23 are formed from the same impurity region in the substrate. Accordingly, the second impurity region 23 is similarly controlled by a signal for controlling the drain region 54.

The second gate 21 of the second assistance element 20 is, inside the drain region 54, connected to the floating gate 52.

In this embodiment, the source region 53 is shared by two memory cells. In the illustration in FIG. 3A, a memory cell 42 and the memory cell on the left (in FIG. 3A, this also applies to the positional relationships described below) share the source region 53. Similarly, the drain region 54 is shared by the memory cell 42 and the memory cell on the right. In addition, the first assistance element 10 is shared by four adjacent memory cells. In FIG. 3A, the first assistance element 10 is shared by the memory cell 42 and the memory cells on the right, above, and on the upper right. These are mere examples and may be replaced with other configurations.

Next, FIG. 4 is a timing chart of an operation signal of the semiconductor device according to this embodiment, showing three operations of erasing, writing, and reading.

First, in an erasing operation, the selection gate 51 and the drain region 54 have a ground voltage, and a high voltage is applied to the first impurity region 13. Accordingly, the electric charges existing in the floating gate 52 are extracted through the underlying gate insulating film to the semiconductor substrate. As a result, the floating gate 52 has a low threshold.

Next, in a writing operation, the selection gate 51 is turned on, a high voltage is also applied to the drain region 54 so that a current flows from the drain region 54 to the source region 53. At this time, hot carriers are generated whose charges pass through the gate insulating film and enter the floating gate 52. As a result, the floating gate 52 has a high threshold. At an application of a high voltage to the drain region 54, a capacitance including fringe capacitances of the side surfaces of the gate between the drain region 54 and the floating gate 52 increases the potential of the floating gate 52. At this time, a voltage is also applied to the first impurity region 13 to assist the increase in the potential of the floating gate 52. That is, the current flows more easily and generates hot carriers easily. Since a high voltage is also applied to the second impurity region 23, the capacitance including the fringe capacitances further increases the potential of the floating gate 52. This also allows the current to flow more easily and generate hot carriers easily.

In the example of FIG. 4, a voltage of 10 V is applied to each of the selection gate 51, the drain region 54, and the first impurity region 13.

Next, in a read operation, a voltage of 5 V is applied to the selection gate 51, whereas a voltage of 1 V is applied to the drain region 54. Depending on a flowing current, data of 0 or 1 is recognized. Here, since the power supply has a voltage of 5 V in a normal operation as an example, the voltage of 5 V is applied to the selection gate 51. The voltage of 1 V is applied to the drain region 54 as an example of a relatively low voltage. If a higher voltage is applied, a large current flows and generates hot carriers, which is the same or similar to the writing. To reduce this, a low voltage is desirable, for example, 1 V as described above.

In this embodiment, the second impurity region 23 is simultaneously controlled by a signal for controlling the drain region 54. That is, once a high voltage of 10 V is applied to the drain region 54 in a writing operation, the voltage of 10 V is also applied to the second impurity region 23. This serves as an assistance to increase the potential of the floating gate 52. As a result, the current flowing from the drain region 54 to the source region 53 further increases and generates hot carriers easily. This allows an efficient writing operation in a short time.

The second assistance element 20 is located in the drain region 54, which reduces the layout area increased by the second assistance element 20.

As described above, in the semiconductor device according to this embodiment, hot carriers are efficiently generated in a writing operation using both the first and second assistance elements 10 and 20.

In the writing operation, causing such high-energy charges to efficiently reach the floating gate 52 is important. If the energy at the hot carrier generation is weak and insufficient, the charges are easily trapped in the gate insulating film without reaching the floating gate 52. Such charges of the gate insulating film are difficult to erase even in an erasing operation. In addition, when the charges are discharged from the gate insulating film due to a high temperature or other factors, there is an influence such as deterioration of data retention characteristics. Efficiently generating hot carriers is important in a writing operation, which is achieved by the semiconductor device according to this embodiment.

The second gate 21 is in a T-shape including a part extending along the gate length of the floating gate 52 and a part extending orthogonal to the gate length. Accordingly, the second gate 21 has increased side surfaces, which increases the fringe capacitances and improves the assistance effect. This is however not necessarily essential.

Variation 1 of First Embodiment

Next, Variation 1 of the first embodiment will be described. While the circuit configuration and the layout are the same or similar to those in the first embodiment shown in FIGS. 2 and 3A, there is a difference in the operation.

Next, FIG. 5 is a timing chart of an operation signal. Among erasing, writing, and reading operations, the writing operation is different from that in the first embodiment (FIG. 4). Specifically, a voltage of 5 V is applied to the first impurity region 13 in the writing operation.

In general, hot carriers tend to be generated at a point with a maximum substrate current. The substrate current increases when the gate voltage is about the half the drain voltage, which generates hot carriers easily. There is a desirable voltage for assisting the potential of the floating gate 52 by the first impurity region 13. This depends on the gate capacitance ratio of the floating gate 52 and the first gate 11 or other factors, the inventors have found a desirable voltage as an experiment result. According to this finding, the first impurity region 13 has a lower voltage than the drain region 54 in one preferred embodiment. The first impurity region 13 with a voltage within a range of about ±20% the half the voltage of the drain region 54 (i.e., 40% to 60% the voltage of the drain region 54) efficiently generates hot carriers. In the example of FIG. 5, the first impurity region 13 has a voltage of 5 V with respect to the voltage 10 V of the drain region 54.

This configuration efficiently provides high-energy hot carriers, which largely reduces the charges trapped in the gate insulating film in a writing operation. This results in a large reduction in an increase in the erasing time. A decrease in the voltage to the first impurity region 13 in a writing operation (from the example of the first embodiment) provides the advantage of reducing disturbance in the writing operation. Once a high voltage is applied to the first impurity region 13 before a voltage is applied to the drain region 54 in a writing operation, the erasing is performed. As a result, the written cell may be disturbed to be erased. As in this variation, however, if a voltage 5 V lower than the voltage 10 V, which is applied to the drain region 54, for example, is applied to the first impurity region 13, there is almost no possibility of erasing.

As described above, a relatively low voltage is applied to the first impurity region 13 in a writing operation, which improves the efficiency in the writing operation and reduces the disturbance in the writing operation and an increase in the erasing time.

Variation 2 of First Embodiment

Next, Variation 2 of the first embodiment will be described. While the circuit configuration and the operation in this variation are the same or similar to those in the first embodiment and the variation, a semiconductor has a different layout.

Figure 6:
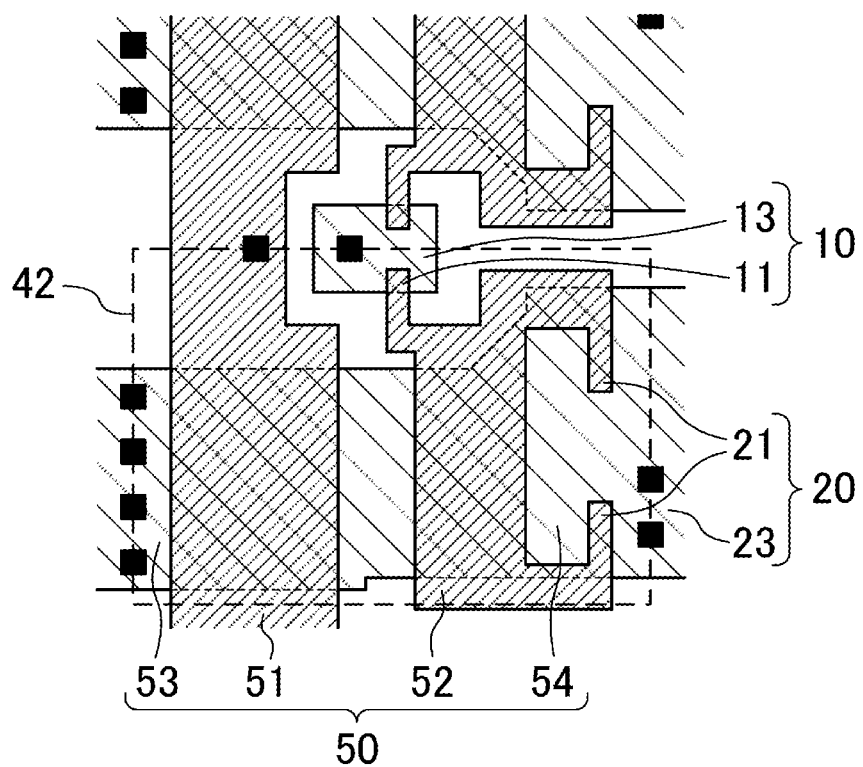
FIG. 6 shows a layout of a semiconductor device according to Variation 2 of the first embodiment.

FIG. 6 shows the layout of the semiconductor device according to this variation. Like FIG. 3A, for example, FIG. 6 also shows a memory cell including the memory element 50, the first assistance element 10, and the second assistance element 20. However, the elements have different configurations in a plan view.

In this variation as well, the second assistance element 20 is formed in the drain region 54 of the memory element 50. The second gate 21 of the second assistance element 20 is, inside the drain region 54, connected to the floating gate 52. However, this connection between the floating gate 52 and the second gate 21 is made near an end of the floating gate 52 in the direction along the gate width (in the vertical direction in FIG. 6).

With such a layout, the second assistance element 20 does not block the region in which a current of the transistor including the floating gate 52 flows. Accordingly, the current easily flows through the memory element 50 and eventually, the writing efficiency improves. As compared with the layout in FIG. 3A, the second assistance element 20 has a large region and a high assistance effect.

In this variation, as a layout, the first assistance element 10 is shared only by the memory cells selected by the same selection gate 51. In FIG. 6, the first assistance element 10 is shared by the memory cell 42 indicated by the broken line and the adjacent memory cell thereabove. This configuration is advantageous in causing no disturbance in the memory cells unselected by the same selection gate 51.

Variation 3 of First Embodiment

Next, Variation 3 of the first embodiment will be described. While the circuit configuration and the operation in this variation are the same or similar to those in the first embodiment and the variations, a semiconductor has a different layout.

Figure 7:
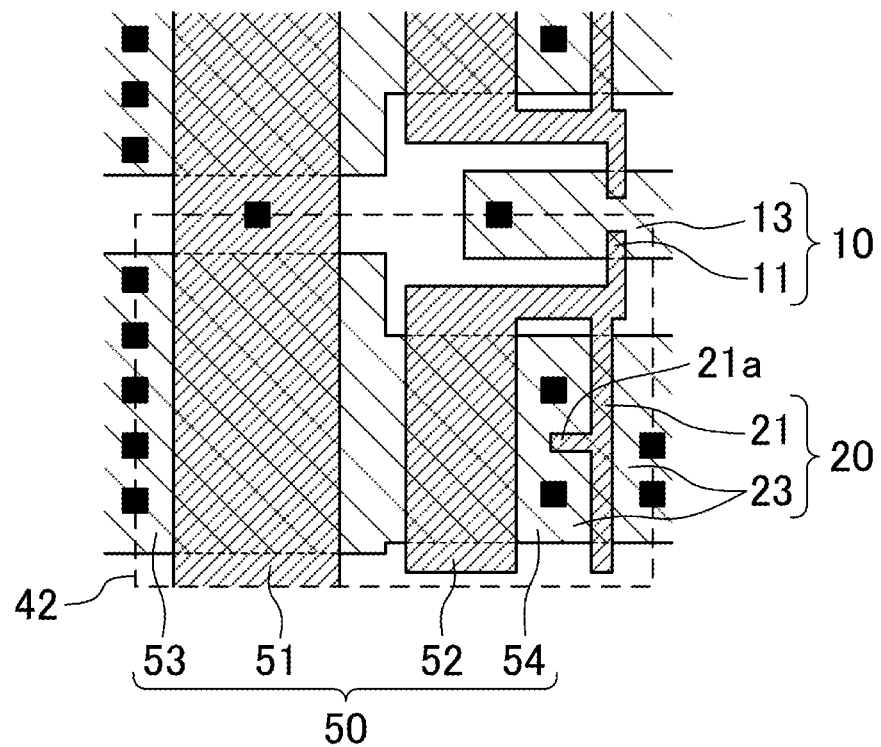
FIG. 7 shows a layout of a semiconductor device according to Variation 3 of the first embodiment.

FIG. 7 shows a layout of the semiconductor device according to this variation. Like FIG. 3A, for example, FIG. 7 also shows a memory cell including the memory element 50, the first assistance element 10, and the second assistance element 20. However, the elements have different configurations in a plan view.

In the layout shown in FIG. 3A, the second gate 21 of the second assistance element 20 is, inside the drain region 54, connected to the floating gate 52. On the other hand, in the layout according to this variation shown in FIG. 7, the second gate 21 is, outside the drain region 54, connected to the floating gate 52. More specifically, there is a region doped with no impurities below the second gate 21. Thus, the part between the floating gate 52 and the second gate 21 serves as the drain region 54 of the memory element 50 and a part of the second impurity region 23 of the second assistance element 20. Located on the side of the second gate 21 opposite to the drain region 54 is another part of the second impurity region 23.

With such a layout, the second assistance element 20 does not block the region in which a current of the transistor including the floating gate 52 flows. Accordingly, the voltage applied to the drain region 54 in a writing operation increases the potential of the floating gate 52 using the effect of the coupling capacitance. This improves the writing efficiency and allows writing in a short time.

In the example of FIG. 7, the second gate 21 includes a projection 21a extending toward the floating gate 52 in addition to the part extending along the gate width of the floating gate 52. This configuration increases the side surfaces of the gate and the coupling capacitance. The number of the projection 21a is not limited to one and may be a plurality in the case of FIG. 7. The projection 21a of the second gate 21 may extend in the direction opposite to the floating gate 52.

A larger coupling capacitance in the second gate 21 provides the advantage of reducing an increase in the potential of the floating gate 52, when a voltage is applied to the first impurity region 13 of the first assistance element 10 to assist erasing and writing operations. Accordingly, the voltage applied to the first impurity region 13 in an erasing operation functions more efficiently. This results in a shorter erasing time and an application of a lower erasing voltage.

Variation 4 of First Embodiment

Next, Variation 4 of the first embodiment will be described. In particular, a difference from Variation 3 will be described. While the circuit configuration and the operation in this variation are the same or similar to those in the first embodiment and the variations, a semiconductor has a different layout.

Figure 8:
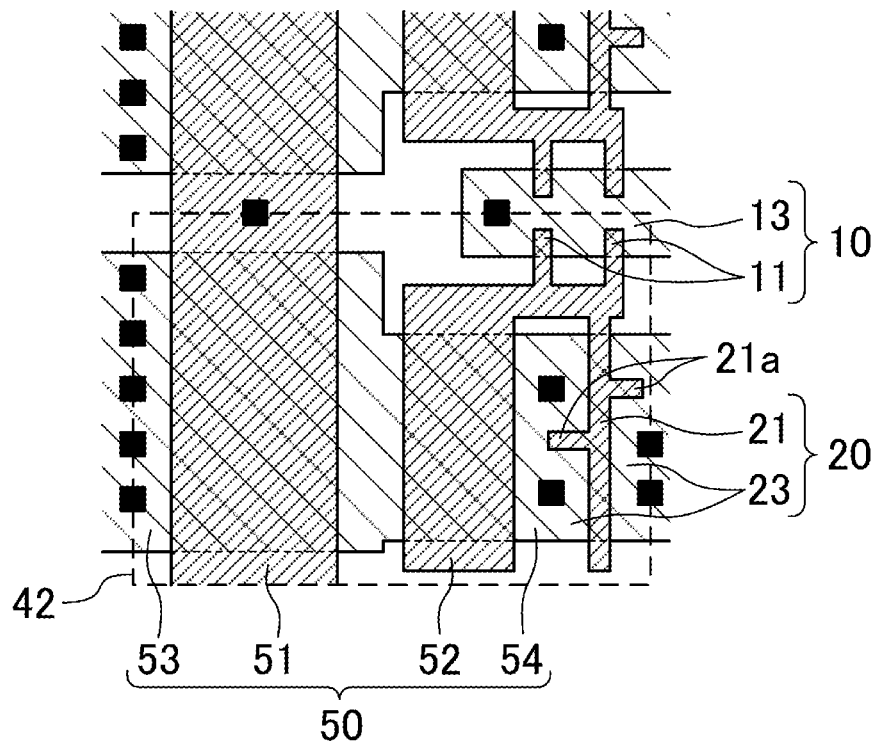
FIG. 8 shows a layout of a semiconductor device according to Variation 4 of the first embodiment.

FIG. 8 shows a layout of the semiconductor device according to this variation. Like FIG. 3A, for example, FIG. 8 also shows a memory cell including the memory element 50, the first assistance element 10, and the second assistance element 20. However, the elements have different configurations in a plan view.

In the layout according to Variation 3 shown in FIG. 7, the first assistance element 10 has one first gate 11, which extends to the same first impurity region 13 from above and below in FIG. 7. This is because the memory cell 42 and the adjacent memory cell thereabove share the first impurity region 13. The first assistance element 10 of the memory cell 42 includes one first gate 11.

On the other hand, in the layout according to this variation shown in FIG. 8, first gates 11 are as two independent projections to the first impurity region 13. This configuration efficiently increases the side surfaces of the gate and the fringe capacitances. As a result, the coupling capacitance increases, and the charges of the floating gate 52 are efficiently extracted in an erasing operation. In assisting an increase in the potential of the floating gate 52 in a writing operation as well, the potential of the floating gate 52 further increases.

In this variation, the number of the projections is two, but may be three or more. The projections may be in different shapes. Examples of the shapes include widths and lengths which may be set in view of the processing accuracy and other factors in the manufacture in addition to desirable amounts. The projections need to be arranged at intervals so that the electric field bridges the side surfaces of the gate.

In FIG. 8, each projection 21a of the second gate 21 of the second assistance element 20 is closer to or farther from the floating gate 52. This configuration provides the advantages as described in Variation 3.

Variation 5 of First Embodiment

Next, Variation 5 of the first embodiment will be described. In particular, a difference from Variation 4 will be described. While the circuit configuration and the operation in this variation are the same or similar to those in the first embodiment and the variations, a semiconductor has a different layout.

Figure 9:
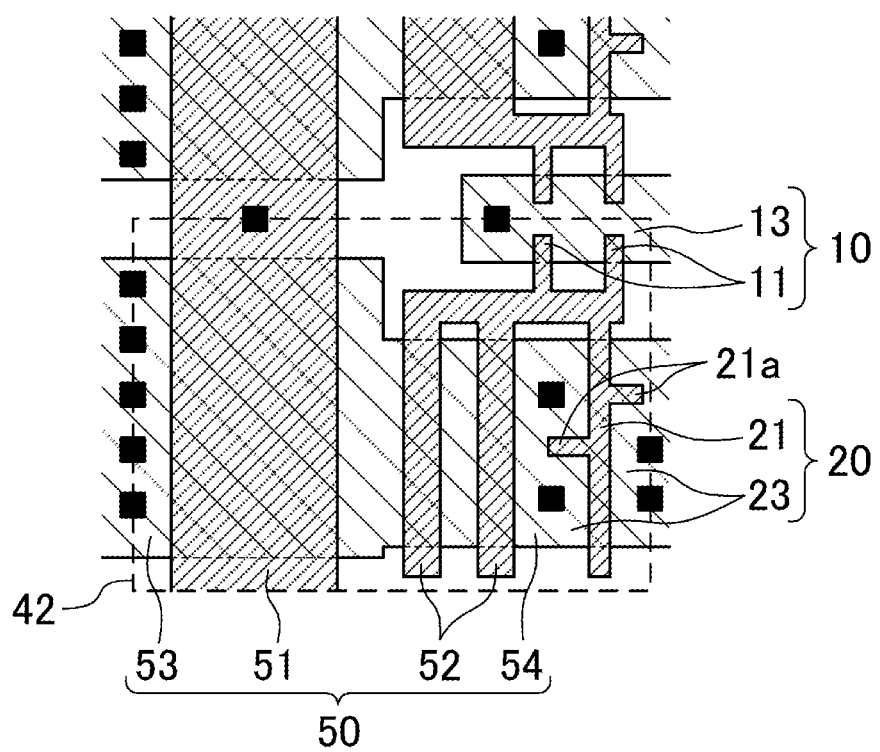
FIG. 9 shows a layout of a semiconductor device according to Variation 5 of the first embodiment.

FIG. 9 shows a layout of the semiconductor device according to this variation. Like FIG. 3A, for example, FIG. 9 also shows a memory cell including the memory element 50, the first assistance element 10, and the second assistance element 20. However, the elements have different configurations in a plan view.

In the layout shown in FIG. 9, the floating gate 52 of the memory element 50 includes two gates. Each gate has a shorter gate length (i.e., transverse size in FIG. 9) than in FIG. 8, which generates hot carriers more easily. This results in a shorter writing time. A simply reduced gate length may increase a leakage current in an off-state of the transistor including the floating gate 52. In the layout shown in FIG. 9, however, the floating gate 52 includes the plurality of gates, which reduces an increase in the leakage current.

While FIG. 9 illustrates a configuration including two gates with the same gate length, three or more gates may be provided in different shapes. Gates overlapping at the boundary between an active region and an isolation region tend to cause a leakage. With a larger thickness, the gates at such the boundary reduce the leakage.

Variation 6 of First Embodiment

Next, Variation 6 of the first embodiment will be described. In particular, a difference from Variation 5 will be described. While the circuit configuration and the operation in this variation are the same or similar to those in the first embodiment and the variations, a semiconductor has a different layout.

Figure 10:
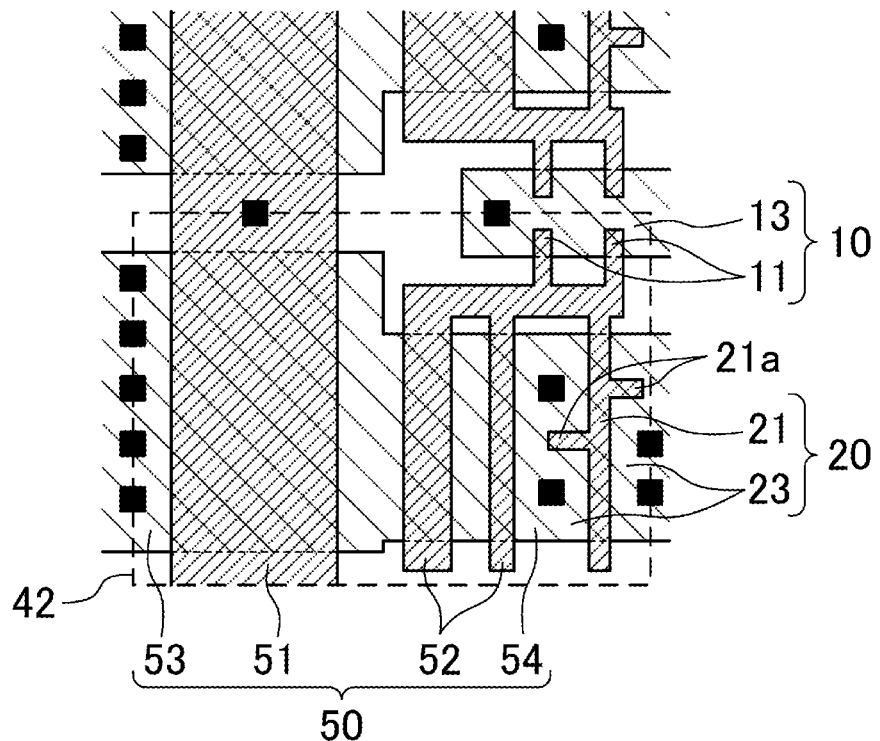
FIG. 10 shows a layout of a semiconductor device according to Variation 6 of the first embodiment.

FIG. 10 shows a layout of the semiconductor device according to this variation. Like FIG. 3A, for example, FIG. 10 also shows a memory cell including the memory element 50, the first assistance element 10, and the second assistance element 20. However, the elements have different configurations in a plan view.

In the layout shown in FIG. 10 as well, the floating gate 52 of the memory element 50 includes two gates. While the two gates have the same gate length in Variation 5 (FIG. 9), the gate closer to the drain region 54 has a shorter gate length than the other in this variation.

With this configuration, the gate with a shorter gate length generates hot carriers easily, and the gate with a longer gate length reduces the leakage current in an off-state of the transistor. Different from FIG. 10, the gate closer to the drain region 54 may have a longer gate length than the other. The lengths may be designed as desired as appropriate depending on the bridging of the electric field or the characteristics of the transistor. In this variation as well, the floating gate 52 may include three or more gates.

Variation 7 of First Embodiment

Next, Variation 7 of the first embodiment will be described. In particular, a difference from Variation 4 will be described. While the circuit configuration and the operation in this variation are the same or similar to those in the first embodiment and the variations, a semiconductor has a different layout. There is also a difference in the control method.

Figure 11:
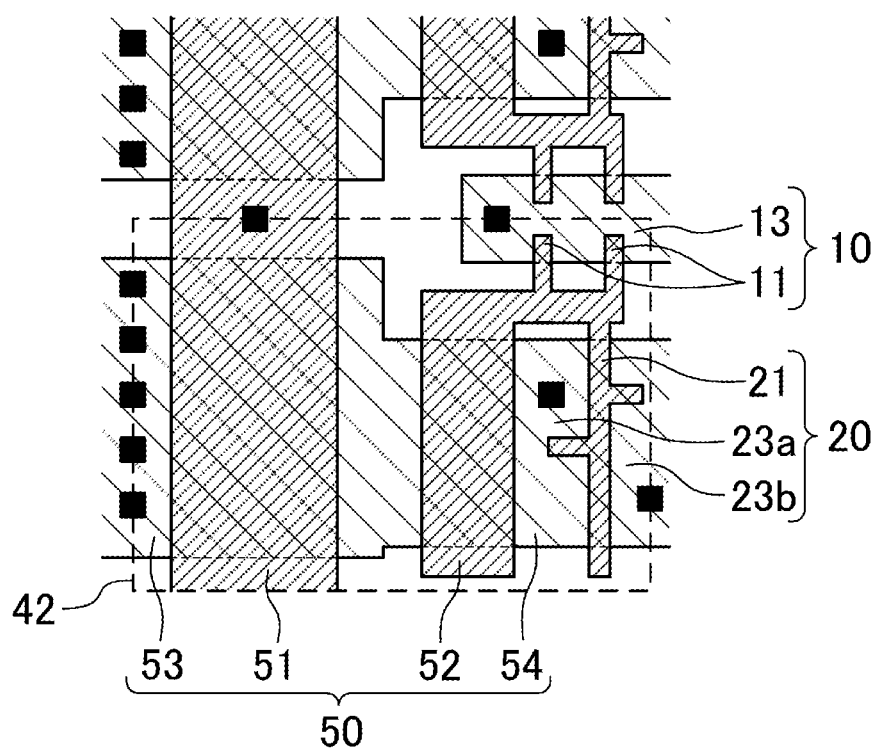
FIG. 11 shows a layout of a semiconductor device according to Variation 7 of the first embodiment.

FIG. 11 shows a layout of the semiconductor device according to this variation. Like FIG. 3A, for example, FIG. 11 also shows a memory cell including the memory element 50, the first assistance element 10, and the second assistance element 20. However, the elements have different configurations in a plan view.

As compared to Variation 4 (FIG. 8), the floating gate 52 has a long gate length in this variation. In Variation 4, the impurity regions on respective sides of the second gate 21 are as the second impurity regions 23 controlled by a common signal. The impurity regions are controlled by different signals in this variation. Specifically, the impurity regions include a first drain 23a between the floating gate 52 and the second gate 21, and a second drain 23b on the opposite side. The first and second drains 23a and 23b are connected to different signal lines and controlled independently.

In a writing operation, a high voltage is applied to each of the first and second drains 23a and 23b to increase the potential of the floating gate 52 and generate hot carriers. This improves the writing efficiency and reduces the writing time. This operation is the same or similar to that in Variation 4. Since the floating gate 52 has a shorter gate length than in Variation 4, which generates hot carriers easily.

On the other hand, in a reading operation, a reading voltage is applied to only the second drain 23b to read the current at that time. With this configuration, the second gate 21 and the floating gate 52 function as two parallel floating gates through which a current flows. Accordingly, the leakage current reliably decreases at an off-state.

As described above, the first and second drains 23a and 23b are controlled by different signals, which allows a more efficient writing operation and efficiently reduces the leakage current at an off-state in a reading operation.

Variation 8 of First Embodiment

Next, Variation 8 of the first embodiment will be described. In particular, a difference from Variation 7 will be described. While the circuit configuration and the operation in this variation are the same or similar to those in the first embodiment and the variations, a semiconductor has a different layout. There is also a difference in the control method.

Figure 12:
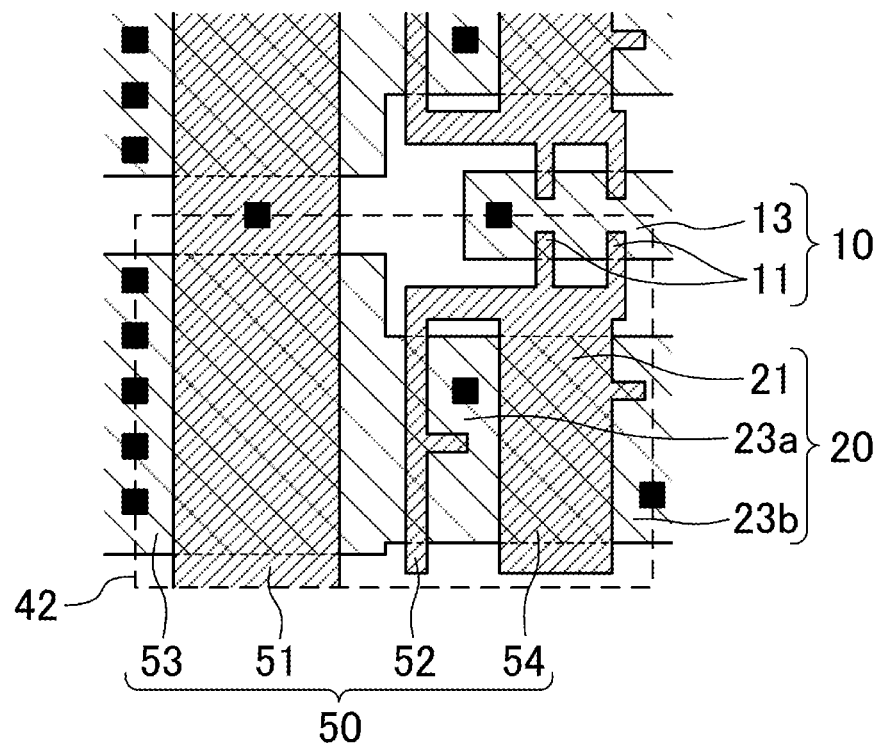
FIG. 12 shows a layout of a semiconductor device according to Variation 8 of the first embodiment.

FIG. 12 shows a layout of the semiconductor device according to this variation. Like FIG. 11, FIG. 12 also shows a memory cell including the memory element 50, the first assistance element 10, and the second assistance element 20. As in Variation 7, the impurity regions include the first drain 23a between the floating gate 52 and the second gate 21, and the second drain 23b on the opposite side. The drains are controlled by different signals.

In this variation, the floating gate 52 has a shorter gate length and the second gate 21 has a longer gate length than in Variation 7. As a result, the floating gate 52 has a longer gate length than the second gate 21.

The control method is the same or similar to that in Variation 7. That is, in a writing operation, a high voltage is applied to each of the first and second drains 23a and 23b. The floating gate 52 with a shorter gate length as described above generates hot carriers more easily and allows the writing operation in a shorter time. In a reading operation, a high voltage is applied to only the second drain 23b. In addition to the floating gate 52, the second gate 21 functions as one of parallel floating gates and has a longer gate length, which reduces the leakage current in an off-state.

Second Embodiment

Figure 13:
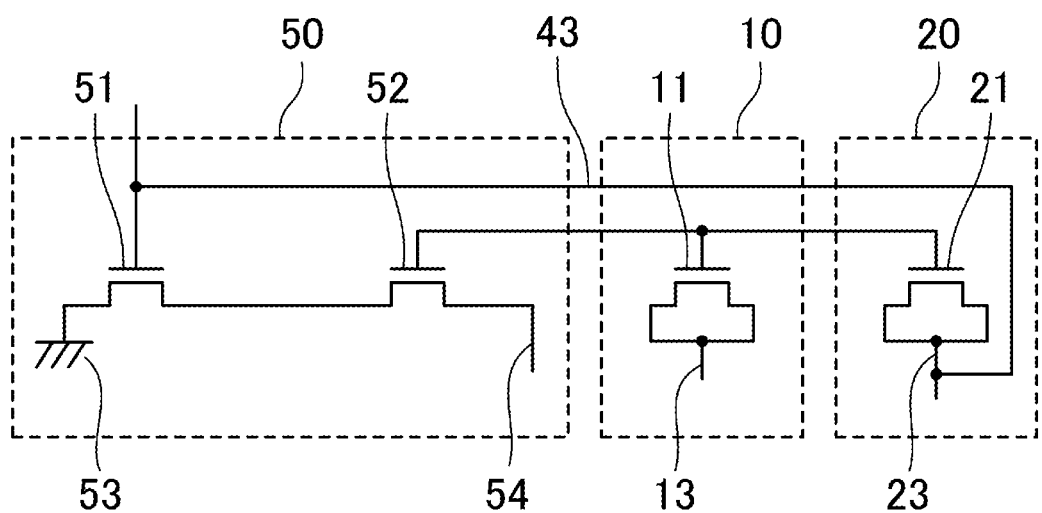
FIG. 13 shows a circuit configuration of a semiconductor device according to a second embodiment.

Next, a second embodiment of the present disclosure will be described. FIG. 13 illustrates a circuit configuration of a semiconductor device according to this embodiment. This figure corresponds to the basic circuit configuration shown in FIG. 1 and shows that the second impurity region 23 of the second assistance element 20 is electrically connected to the selection gate 51 of the memory element 50. FIG. 13 shows such an electrical connection 43. Since the selection gate 51 is connected to a word line, the second impurity region 23 is also connected to the word line.

With this configuration, in the semiconductor device according to this embodiment, the second impurity region 23 is controlled by a signal for controlling the selection gate 51.

Figure 14:
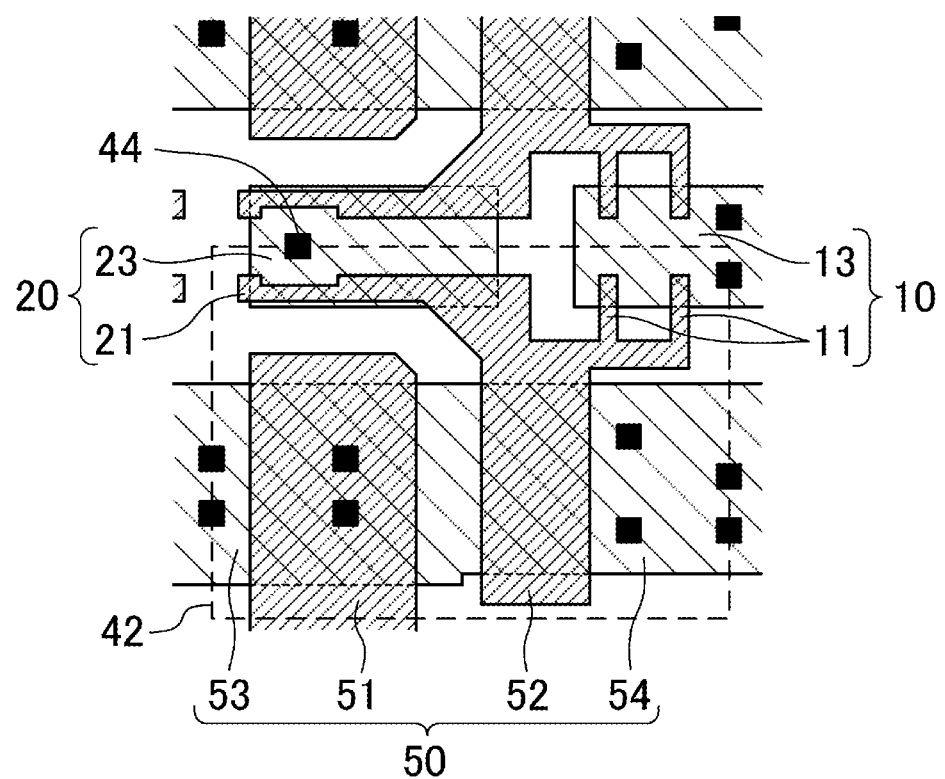
FIG. 14 shows a layout of the semiconductor device shown in FIG. 13.

FIG. 14 shows a specific example layout of the semiconductor device corresponding to the circuit configuration shown in FIG. 13. As in the first embodiment, the selection and floating gates 51 and 52 are arranged in series between the source and drain regions 53 and 54. In addition, the first assistance element 10 is formed including the first gate 11 and the first impurity region 13, whereas the second assistance element 20 is formed including the second gate 21 and the second impurity region 23.

The first assistance element 10 is used for assistance in an erasing operation. The first assistance element 10 is formed using the first impurity region 13 independent from the drain region 54. In the example in FIG. 14, the first gate 11 includes two projections which are not essential. The number of the projections may be one, three, or more, in view of the erasing efficiency, the layout area, and other factors.

In this embodiment, the second assistance element 20 is also formed using the second impurity region 23 independent from the drain region 54. In this layout, the second impurity region 23 is located near the transistor including the selection gate 51. A node 44 corresponding to the second impurity region 23 is connected to the selection gate 51.

In the layout shown in FIG. 14, the source region 53 is shared by the memory cell 42 and an adjacent memory cell (e.g., on the left in FIG. 14). In addition, the first assistance element 10 is shared by four adjacent memory cells. Note that the first assistance element 10 may be shared only by the memory cells selected by the same selection gate 51 and not by the memory cells selected by the different selection gates.

The semiconductor with the configuration described above may have the operation timing as shown in FIG. 4.

In the semiconductor device according to this embodiment, the second assistance element 20 is controlled by a signal for controlling the selection gate 51. Accordingly, a high voltage (e.g., 10 V) applied to the drain region 54 in a writing operation allows the second assistance element 20 to assist the floating gate 52 and further increases the potential of the floating gate 52. As a result, the current flowing from the drain region 54 to the source region 53 further increases to generate hot carriers easily. This allows an efficient writing operation in a short time. Available in a writing operation is the advantage of assisting an increase in the potential of the floating gate 52 by a voltage application to the first impurity region 13 of the first assistance element 10.

In a reading operation, a voltage is applied to the selection gate 51. At the same time, this signal causes an application of a voltage to the second impurity region 23. As a result, there is an assistance to increase the potential of the floating gate 52 via a capacitance of the second assistance element 20, which increases the current in the reading operation. If the same determination current is used in the reading operation, a shorter erasing time suffices.

In this respect, in the writing, the threshold is high and the reading operation causes no current flow. In the erasing, the threshold is low and the reading operation causes a current flow. There is further the following state. the erasing is insufficiently performed and no predetermined current flows without any assistance effect (determined as the "writing") but a predetermined current flows with the assistance effect (determined as the "erasing"). If there is an assistance effect in an erasing operation, it is determined that the "erasing" started in this state. A shorter time is required to determine an erasing mode.

Third Embodiment

Next, a third embodiment of the present disclosure will be described. This embodiment provides a configuration obtained by combining the configurations in the first and second embodiments.

Figure 15:
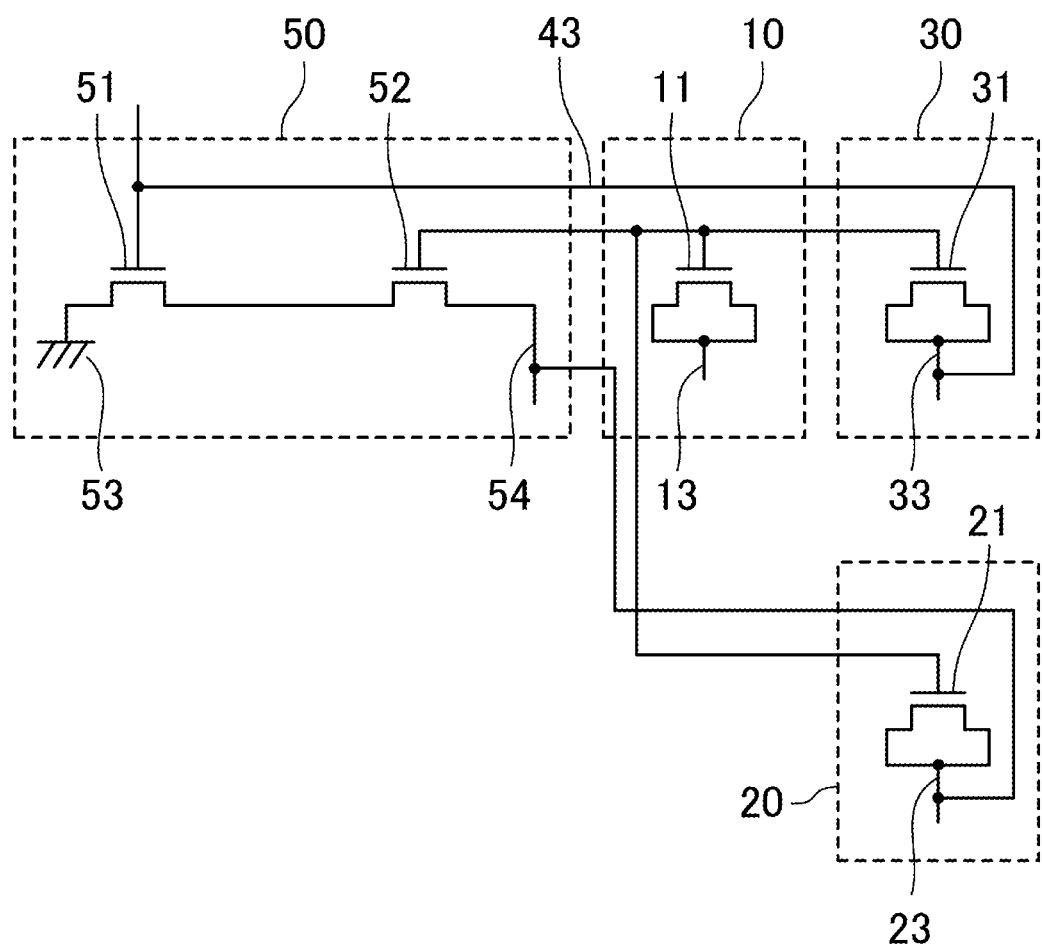
FIG. 15 shows a circuit configuration of a semiconductor device according to a third embodiment.

First, a circuit configuration will be described. FIG. 15 illustrates a circuit configuration of a semiconductor device according to this embodiment.

In FIG. 15, the memory element 50 and the first assistance element 10 are the same or similar to those in the embodiments described above. The semiconductor device according the first embodiment includes the second assistance element 20 including the second impurity region 23 controlled by a signal for controlling the drain region 54. The semiconductor device according to this embodiment also includes the same assistance element (herein also referred to as a "second assistance element 20"). In addition, the semiconductor device according the second embodiment includes the second assistance element 20 including the second impurity region 23 controlled by a signal for controlling the selection gate 51. The semiconductor device according to this embodiment also includes the same assistance element (hereinafter referred to as a "third assistance element 30" for the sake of distinction). The third assistance element 30 includes a third impurity region 33 and a third gate electrode 31 on the semiconductor substrate.

Figure 16:
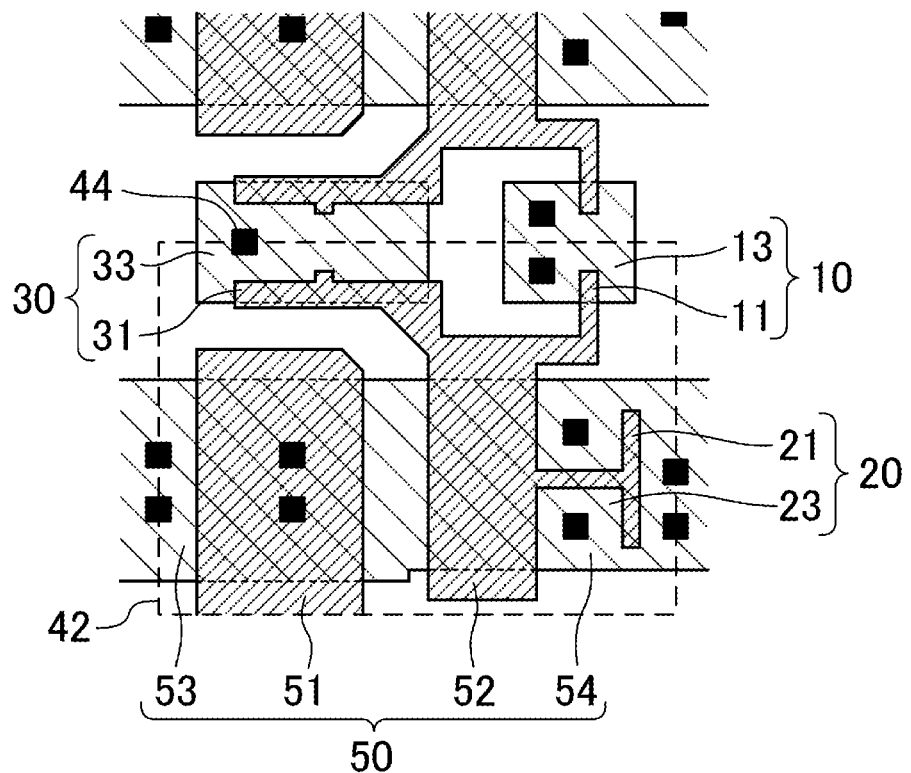
FIG. 16 shows a layout of the semiconductor device shown in FIG. 15.

FIG. 16 shows a specific example layout of the semiconductor device corresponding to the circuit configuration shown in FIG. 15.

As in FIG. 3A, the memory element 50 includes the selection gate 51 and the floating gate 52 in series between the source region 53 and the drain region 54. The same impurity region as the drain region 54 serves as the second impurity region 23. The second assistance element 20 including the second gate 21 has a configuration the same or similar to that in FIG. 3A.

As an assistance element that is the same or similar to the second assistance element 20 in FIG. 14, there is the third assistance element 30 including the third impurity region 33 and the third gate electrode 31 independently from the drain region 54.

As in FIG. 3A, for example, the first assistance element 10 includes the first impurity region 13 and the first gate 11 independent from the drain region 54. Being shared by four adjacent memory cells in FIG. 3A, the first assistance element 10 is shared only by two adjacent memory cells selected by the selection gate 51 at the same time in the layout shown in FIG. 14.

The second and third assistance elements 20 and 30 in this embodiment have functions the same or similar to those in the first and second embodiments. In a writing operation, both the second and third assistance elements 20 and 30 assist to increase the potential of the floating gate 52, which improves the writing efficiency. In a reading operation, the third assistance element 30 assists the floating gate 52, which causes a larger current. If the same determination current is used in the reading operation, a shorter erasing time suffices as described in the second embodiment.

Variation 1 of Third Embodiment

Next, Variation 1 of the third embodiment will be described. While the circuit configuration and the operation in this variation are the same or similar to those in the third embodiment, a semiconductor has a different layout.

Figure 17:
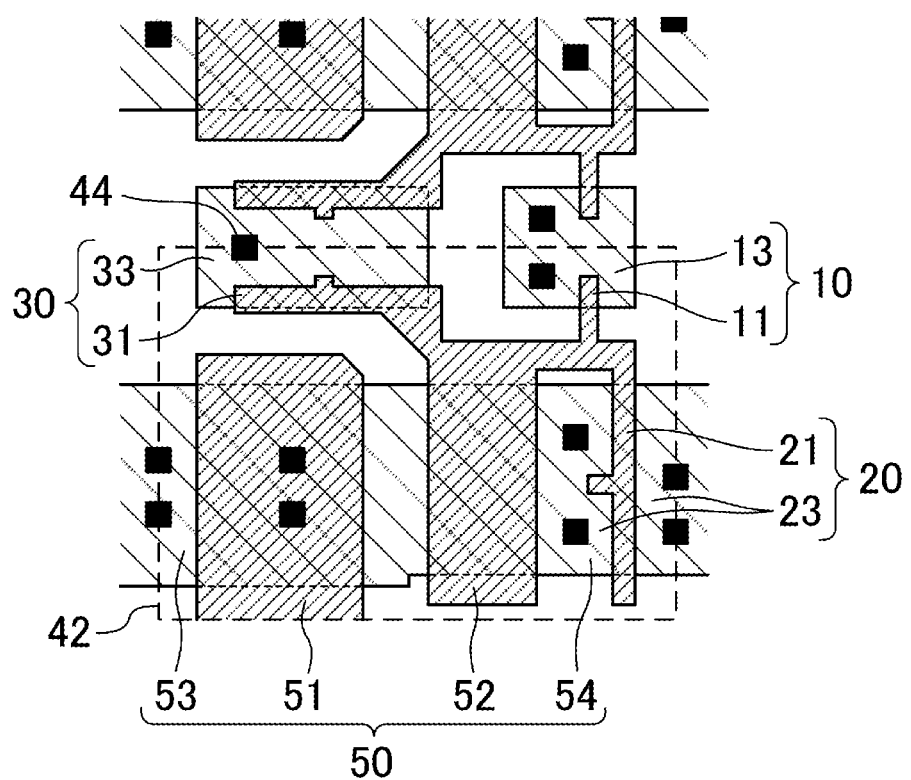
FIG. 17 shows a layout of a semiconductor device according to Variation 1 of the third embodiment.

FIG. 17 shows a layout of the semiconductor device according to this variation. This layout differs from that in FIG. 16 in the configuration of the second assistance element 20. The second assistance element 20 according to this variation is the same or similar to that in Variation 3 of the first embodiment (see FIG. 7). That is, the second gate 21 is, outside the drain region 54, connected to the floating gate 52. As described in Variation 3 of the first embodiment, this improves the writing efficiency and allows writing in a short time.

As described in the third embodiment, the second and third assistance elements 20 and 30 improve the writing efficiency and reduce the erasing time.

Variation 2 of Third Embodiment

Next, Variation 2 of the third embodiment will be described. While the circuit configuration and the operation in this variation are the same or similar to those in the third embodiment, a semiconductor has a different layout.

Figure 18:
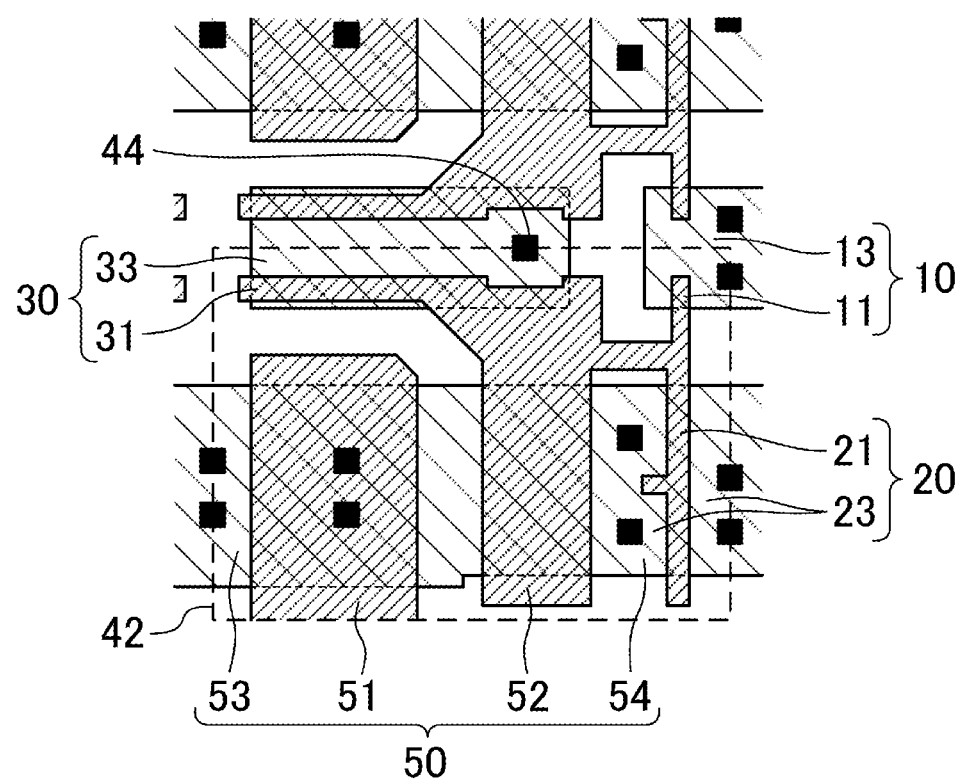
FIG. 18 shows a layout of a semiconductor device according to Variation 2 of the third embodiment.

FIG. 18 shows a layout of the semiconductor device according to this variation. In this layout, the memory element 50 and the second assistance element 20 have configuration the same or similar to those in Variation 1 of the third embodiment (see FIG. 17). The first assistance element 10 includes the first impurity region 13 and the first gate 11 as in Variation 1, but is shared by four adjacent memory cells (e.g., the memory cell 42 and the adjacent memory cells on the right, above, and on the upper right in FIG. 18). With this configuration, the first assistance element 10 according to this variation requires a smaller layout area than in Variation 1 of the third embodiment where the first assistance element 10 is shared only by two adjacent memory cells. As a result, there is a sufficient layout area, which increases the area of the third assistance element 30. Accordingly, the second assistance element 30 has a larger capacitance and a larger current in a reading operation, which efficiently reduces the erasing time.

While some configurations and combinations thereof have been described above in the embodiments and their variations, other combinations may be further employed. While the embodiments and variations have been described assuming that the active regions are formed in a single well or the wells including the active regions are jointed together. However, the configuration is not limited thereto. For example, formed on a semiconductor substrate is a buried oxide (BOX) layer as an insulating layer, on which an active layer is formed to obtain a silicon on insulator (SOI) structure. The active layer includes an active region.

The embodiments described above assume that each memory cell includes N-channel transistors. Each memory cell may include P-channel transistors. Alternatively, each memory cell may include some N-channel transistors and some P-channel transistors. For example, the first gate 11 as an eraser may include an N-channel transistor and the other elements may include P-channel transistors.

The semiconductor device as described above improves the efficiency in writing and erasing operations, and is thus useful as a memory device.

What is claimed is:

1. A semiconductor device comprising:
a memory cell on a semiconductor substrate, the memory cell including a memory element, a first assistance element, and a second assistance element,
the memory element including a source region, a drain region, and a selection gate and a floating gate in series between the source region and the drain region,
the first assistance element including a first impurity region and a first gate on the semiconductor substrate, the first gate being electrically connected to the floating gate,
the second assistance element including a second impurity region and a second gate on the semiconductor substrate, the second gate being electrically connected to the floating gate, and
the second impurity region of the second assistance element being connected to a signal line that is connected to the drain region of the memory element or a signal line that is connected to the selection gate of the memory element.

2. The semiconductor device of claim 1, wherein
the second impurity region of the second assistance element is connected to a signal line that is connected to the drain region of the memory element.

3. A semiconductor device comprising:
a memory cell on a semiconductor substrate, the memory cell including a memory element, a first assistance element, and a second assistance element,
the memory element including a source region, a drain region, and a selection gate and a floating gate in series between the source region and the drain region,
the first assistance element including a first impurity region and a first gate on the semiconductor substrate, the first gate being electrically connected to the floating gate,
the second assistance element including a second impurity region and a second gate on the semiconductor substrate, the second gate being electrically connected to the floating gate,
the second impurity region being connected to a signal line that is connected to the drain region,
the second assistance element being formed in the drain region, and
the second gate and the floating gate being connected inside or outside the drain region.

4. The semiconductor device of claim 1, wherein
the second impurity region is connected to the signal line that is connected to the drain region, and
the floating gate includes a plurality of gates connected in series.

5. The semiconductor device of claim 4, wherein
at least one of the plurality of gates has a gate length different from the others of the plurality of gates.

6. The semiconductor device of claim 1, wherein
the second impurity region includes a first part and a second part separately on respective sides of the second gate,
the first part is connected to the signal line that is connected to the drain region, and
the second part is connected to another signal line.

7. The semiconductor device of claim 1, wherein
the second impurity region of the second assistance element is connected to the signal line that is connected to the selection gate of the memory element.

8. A semiconductor device comprising:
a memory cell on a semiconductor substrate, the memory cell including a memory element, a first assistance element, and a second assistance element,
the memory element including a source region, a drain region, and a selection gate and a floating gate in series between the source region and the drain region,
the first assistance element including a first impurity region and a first gate on the semiconductor substrate, the first gate being electrically connected to the floating gate,
the second assistance element including a second impurity region and a second gate on the semiconductor substrate, the second gate being electrically connected to the floating gate,
the second impurity region being connected to a signal line that is connected to the drain region or a signal line that is connected to the selection gate,
the memory cell including a third assistance element,
the third assistance element including a third impurity region and a third gate on the semiconductor substrate, the third gate being electrically connected to the floating gate, and
the third impurity region being connected to the signal line that is connected to the drain region or the signal line that is connected to the selection gate.

9. The semiconductor device of claim 8, wherein
the second impurity region is connected to the signal line that is connected to the drain region, and
the third impurity region is connected to the signal line that is connected to the selection gate.

10. The semiconductor device of claim 8, wherein
the second assistance element is formed in the drain region, and
the second gate and the floating gate are connected inside the drain region.

11. The semiconductor device of claim 8, wherein
the second assistance element is formed in the drain region, and
the second gate and the floating gate are connected outside the drain region.

12. The semiconductor device of claim 1, wherein
in a writing operation to the memory cell, a voltage lower than a voltage applied to the drain region of the memory element is applied to the first impurity region of the first assistance element.

13. The semiconductor device of claim 12, wherein
the voltage applied to the first impurity region falls within a range from 40% to 60% of the voltage applied to the drain region.

* * * * *